(12) United States Patent
Zhang

(10) Patent No.: US 8,891,573 B2
(45) Date of Patent: Nov. 18, 2014

(54) 6.1 ANGSTROM III-V AND II-VI SEMICONDUCTOR PLATFORM

(71) Applicant: Yong-Hang Zhang, Scottsdale, AZ (US)

(72) Inventor: Yong-Hang Zhang, Scottsdale, AZ (US)

(73) Assignee: Arizona Board of Regents, Scottsdale, AZ (US)

( * ) Notice: Subject to any disclaimer, the term of this patent is extended or adjusted under 35 U.S.C. 154(b) by 0 days.

(21) Appl. No.: 13/893,232

(22) Filed: May 13, 2013

(65) Prior Publication Data

US 2013/0301668 A1 Nov. 14, 2013

Related U.S. Application Data

(60) Provisional application No. 61/646,692, filed on May 14, 2012.

(51) Int. Cl.

| | | |
|---|---|---|
| H01S 5/00 | (2006.01) | |
| H01S 5/30 | (2006.01) | |
| H01S 5/323 | (2006.01) | |
| H01L 21/8252 | (2006.01) | |
| H01S 5/026 | (2006.01) | |
| H01S 5/183 | (2006.01) | |
| H01L 21/8254 | (2006.01) | |
| H01L 29/78 | (2006.01) | |
| H01L 29/267 | (2006.01) | |
| H01L 29/20 | (2006.01) | |
| H01L 27/06 | (2006.01) | |
| H01L 21/8258 | (2006.01) | |
| H01L 29/22 | (2006.01) | |
| H01S 5/042 | (2006.01) | |
| H01S 5/02 | (2006.01) | |
| H01S 5/343 | (2006.01) | |

(52) U.S. Cl.
CPC ............... *H01S 5/323* (2013.01); *H01S 5/3009* (2013.01); *H01L 21/8252* (2013.01); *H01S 5/0261* (2013.01); *H01S 5/18361* (2013.01); *H01L 21/8254* (2013.01); *H01S 5/0425* (2013.01); *H01L 29/78* (2013.01); *H01L 29/267* (2013.01); *H01L 29/20* (2013.01); *H01S 5/021* (2013.01); *H01S 5/34306* (2013.01); *H01L 27/0605* (2013.01); *H01L 21/8258* (2013.01); *H01S 5/3095* (2013.01); *H01L 29/22* (2013.01)
USPC ................... 372/50.1; 372/50.124; 372/50.11; 372/43.01

(58) Field of Classification Search
USPC ...................... 372/50.124, 50.11, 50.1, 43.01
See application file for complete search history.

(56) References Cited

U.S. PATENT DOCUMENTS 3,099,776 A   7/1963   Henneke
5,283,447 A * 2/1994   Olbright et al. ................. 257/85

(Continued)

FOREIGN PATENT DOCUMENTS

CN          102054862          6/2012

OTHER PUBLICATIONS

Datta S. et al., "85nm Gate Length Enhancement and Depletion mode InSb Quantum Well Transistors for Ultra High Speed and Very Low Power Digital Logic Applications", IEEE, Electron Devices Meeting, Washington, DC, pp. 763-766 (2005).

(Continued)

*Primary Examiner* — Kinam Park
(74) *Attorney, Agent, or Firm* — Snell & Wilmer L.L.P.

(57) ABSTRACT

Use of semiconductor materials having a lattice constant of within +/−1.6% of 6.1 angstroms facilitates improved semiconductor device performance and new semiconductor structures, for example integration of field-effect devices and optoelectronic devices on a single wafer. High-mobility channels are enabled, improving device performance.

17 Claims, 10 Drawing Sheets

(56) References Cited

U.S. PATENT DOCUMENTS

| | | |
|---|---|---|
| 5,334,865 A | 8/1994 | Fathimulla et al. |
| 5,382,814 A | 1/1995 | Ashley et al. |
| 5,625,636 A * | 4/1997 | Bryan et al. ............. 372/50.124 |
| 5,796,714 A * | 8/1998 | Chino et al. ............. 372/50.124 |
| 5,856,217 A | 1/1999 | Nguyen et al. |
| 5,912,913 A * | 6/1999 | Kondow et al. ............ 372/45.01 |
| 6,100,548 A | 8/2000 | Nguyen et al. |
| 6,384,432 B1 | 5/2002 | Berenz |
| 6,392,256 B1 * | 5/2002 | Scott et al. .................... 257/184 |
| 6,455,871 B1 | 9/2002 | Shim et al. |
| 6,624,451 B2 | 9/2003 | Ashley et al. |
| 6,770,902 B2 | 8/2004 | Phillips |
| 6,855,963 B1 | 2/2005 | Chu et al. |
| 7,496,122 B2 * | 2/2009 | Bozso et al. ............... 372/38.02 |
| 7,573,059 B2 | 8/2009 | Hudait et al. |
| 2003/0007533 A1 * | 1/2003 | Bosco et al. ..................... 372/50 |
| 2003/0026303 A1 * | 2/2003 | Ouchi ............................. 372/36 |
| 2005/0194613 A1 | 9/2005 | Phillips |
| 2006/0105513 A1 * | 5/2006 | Afzali-Ardakani et al. .. 438/197 |
| 2011/0188533 A1 * | 8/2011 | Lebby ..................... 372/50.124 |

OTHER PUBLICATIONS

Radosavljevic M. et al., "High-Performance 40nm Gate Length InSb P-Channel Compressively Strained Quantum Well Field Effect Transistors for Low-Power (VCC=0.5V) Logic Applications", IEEE, Electron Devices Meeting, San Francisco, CA, pp. 727-730 (2008).

Ashley T. et al., "Heterogeneous InSb quantum well transistors on silicon for ultra-high speed, low power logic applications", Electronics Letters, vol. 43, No. 14 (2007).

Dewey G. et al., "Carrier Transport in High-Mobility III-V Quantum-Well Transistors and Performance Impact for High-Speed Low-Power Logic Applications", IEEE Electron Device Letters, vol. 29, No. 10, pp. 1094-1097 (2008).

"Emerging Research Materials", Challenges for ERM in Alternate Channel Applications, International Technology Roadmap for Semiconductors, pp. 11 (2011).

Singh G. et al., "Molecularbeam Epitaxial Growth of High Quality InSb for Pin Photodetectors", Journal of Vacuum Science and Technology B, vol. 13, Issue 2, pp. 782-785 (1995).

Orr J.M.S. et al., "A Surface-Gated InSb Quantum Well Single Electron Transistor", New Journal of Physics 9, Issue 261, pp. 1-7 (2007).

* cited by examiner

6.1 ANGSTROM III-V AND II-VI SEMICONDUCTOR PLATFORM

CROSS REFERENCE TO RELATED APPLICATIONS

This application claims priority to, and the benefit of, U.S. Provisional Application Ser. No. 61/646,692 entitled "6.1 ANGSTROM III-V AND II-VI SEMICONDUCTOR PLATFORM" and filed May 14, 2012, which is incorporated herein by reference.

FEDERALLY SPONSORED RESEARCH OR DEVELOPMENT

This invention was made with government support under one or more of NSF contract number 1002114 and/or AFRL/IF contract number FA9453-08-2-0228. The Government has certain rights in the invention.

TECHNICAL FIELD

The present disclosure relates to semiconductors, and in particular to semiconductor materials and devices formed from the same.

BACKGROUND

Improved semiconductor materials systems, for example systems employing a similar, or common and/or matched lattice constants, are desirable to facilitate production of semiconductor devices therewith, for example in order to improve process yields, device performance, and/or the like. A similar, or common and/or matched lattice constant can allow monolithic integration of multiple devices with electronic and/or optical functionality, for example, integrating a switching device such as a field effect transistor (FET) with an optical or optoelectronic device such as a semiconductor laser. In particular, improved semiconductor materials systems for optical electronic devices are desirable.

SUMMARY

Systems and methods for fabricating and using semiconductor materials having lattice constants of about 6.1 Å are disclosed. In an exemplary embodiment, a semiconductor system comprises a field-effect transistor (FET) and a vertical-cavity surface-emitting laser (VCSEL). The VCSEL comprises an upper distributed Bragg reflector (DBR), an active region, and a bottom DBR. The FET and VCSEL are formed on a single wafer, and the top layer of the lower DBR is directly coupled to the drain of the FET.

In another exemplary embodiment, a method for constructing a semiconductor system comprises forming, on a silicon substrate, a single-crystal buffer layer of ZnTe; forming, on the single-crystal buffer layer, an electronic switch; and forming, on the single-crystal buffer layer, an optoelectronic device.

In another exemplary embodiment, a semiconductor field-effect transistor (FET), comprises a source, a drain, and a gate coupling the source and the drain. The gate is operable to modulate current between the source and the drain. A gate insulator of the FET comprises single crystal zinc telluride (ZnTe).

BRIEF DESCRIPTION OF THE DRAWINGS

With reference to the following description and accompanying drawings.

DETAILED DESCRIPTION

Figure 1A:
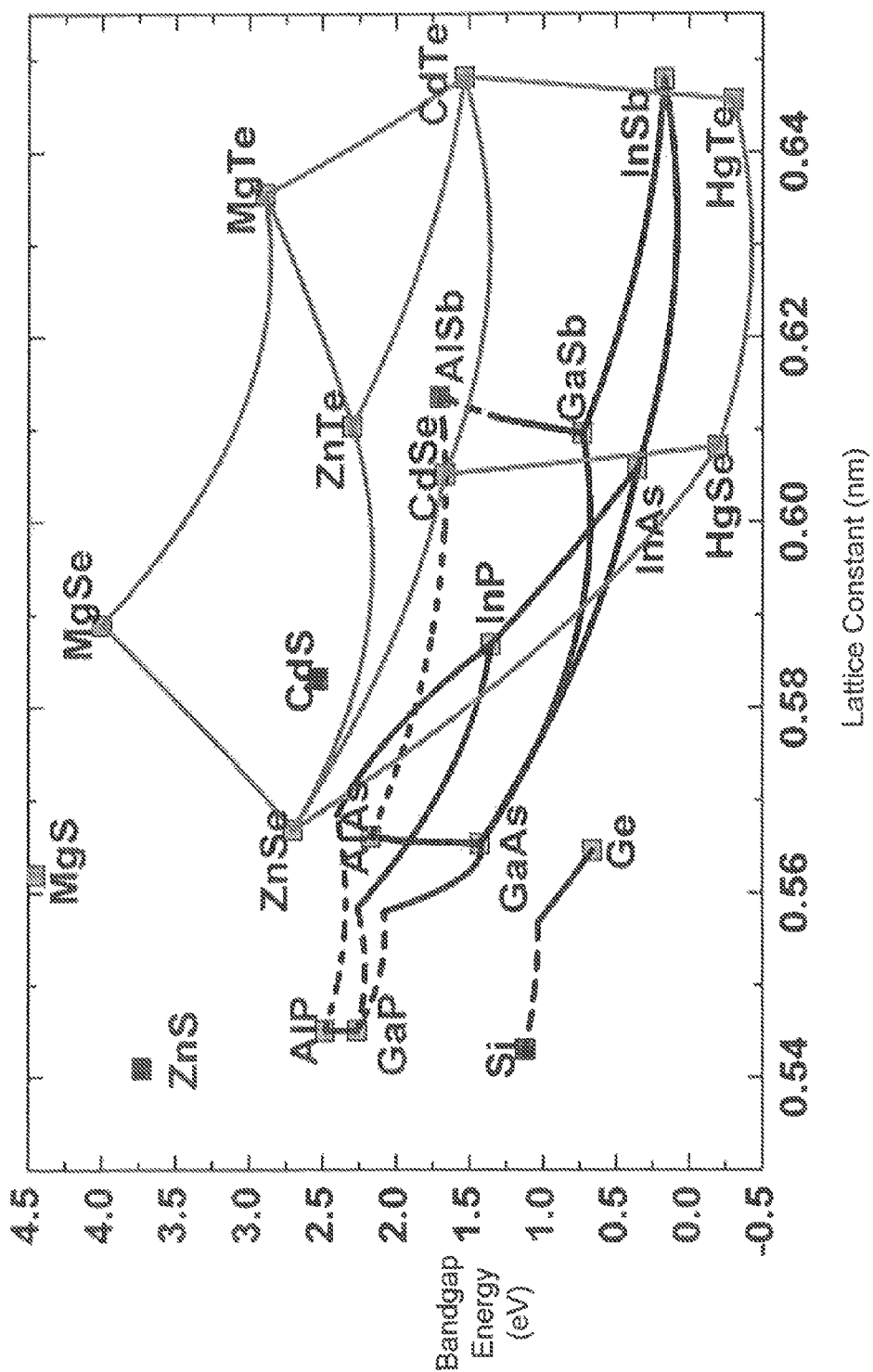
FIG. 1A illustrates a chart of bandgaps of various group II/VI and group III/V alloys in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for semiconductor fabrication, processing, use, and the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a semiconductor materials system or electronic structures formed from the same.

Prior semiconductor devices and systems suffer from various deficiencies. For example, use of oxides as field-effect transistor gate insulator material results in a minimum gate insulator layer thickness of about 10 angstroms, and the gate insulator layer is often rather rough. Accordingly, a further reduction in FET size may be difficult to implement, leading to higher power consumption than is necessary. Moreover, certain electronic devices (for example, optoelectronic devices) are often integrated with other semiconductor devices via a hybrid process utilizing at least two wafers, rather than in a monolithic process on a single wafer, leading to undesirable increases in process complexity, process cost, and/or defect rates. Yet further, prior semiconductor devices and systems often suffered from low electron mobility, limiting performance.

In contrast, these and other shortcomings of prior approaches may be overcome by utilizing principles of the present disclosure, for example as illustrated in various exemplary embodiments. For example, by utilizing materials having a similar lattice constant of about 6.1 angstroms, improved device performance, reduced device feature size, and reduced manufacturing expense may all be achieved. As used herein, "similar lattice constant" means that the two referenced materials have lattice constants differing by at most + and −1.6%. In contrast, "dissimilar lattice constant" refers to two reference materials having a lattice constant differing by more than 1.6%.

Yet further, principles of the present disclosure, for example exemplary semiconductor materials and devices formed from the same, enable significant advantages over prior approaches, including but not limited to (i) InAsSb and/or InGaSb growth on ZnTe/Si; (ii) higher-performance crystalline ZnTe to replace amorphous gate oxide; (iii) higher interface quality, reduced broken bonds, and lower interface scattering; (iv) precise monolayer growth of binary ZnTe, for example leading to a thinner gate insulator; (v) single crystal ZnTe with fewer charges; (vi) large carrier confinement due to wide bandgap of ZnTe (2.3 eV); (vii) provision of a high mobility channel (often over 10-20 times greater than Si); (viii) electron injection velocity in InAs greater than 2× that of Si at $\frac{1}{2}XV_{DD}$; (viii) provision for a narrow device channel yielding outstanding short-channel effects; (ix) faster switching, for example ~600 GHz for an InAs high electron mobility transistor (HEMT); (x) higher current for a given operating voltage, allowing a smaller device footprint; (xi) a larger turn-on slope allowing for lower operating voltages; (xii) a lower gate delay due to lower voltage and higher drive current; (xiii) facilitation of monolithic integration with lasers, photodiodes (PDs), and focal plane arrays (FPAs); and (xiv) provision of a very high reflective II-VI/III-V DBR for VCSELs.

Figure 1B:
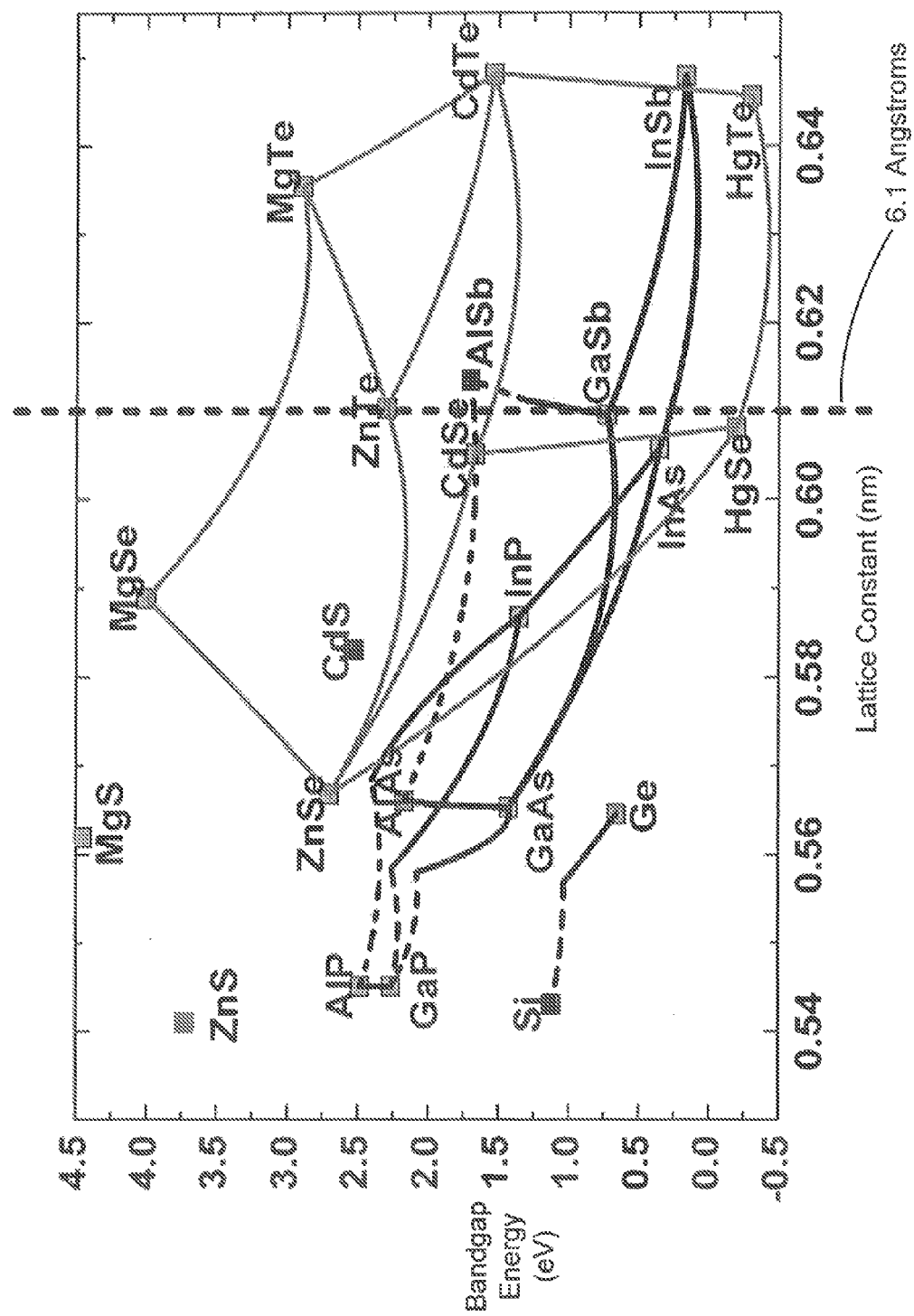
FIG. 1B illustrates the chart of FIG. 1A, highlighting the region of the 6.1 angstrom lattice constant in accordance with an exemplary embodiment.
Figure 1C:
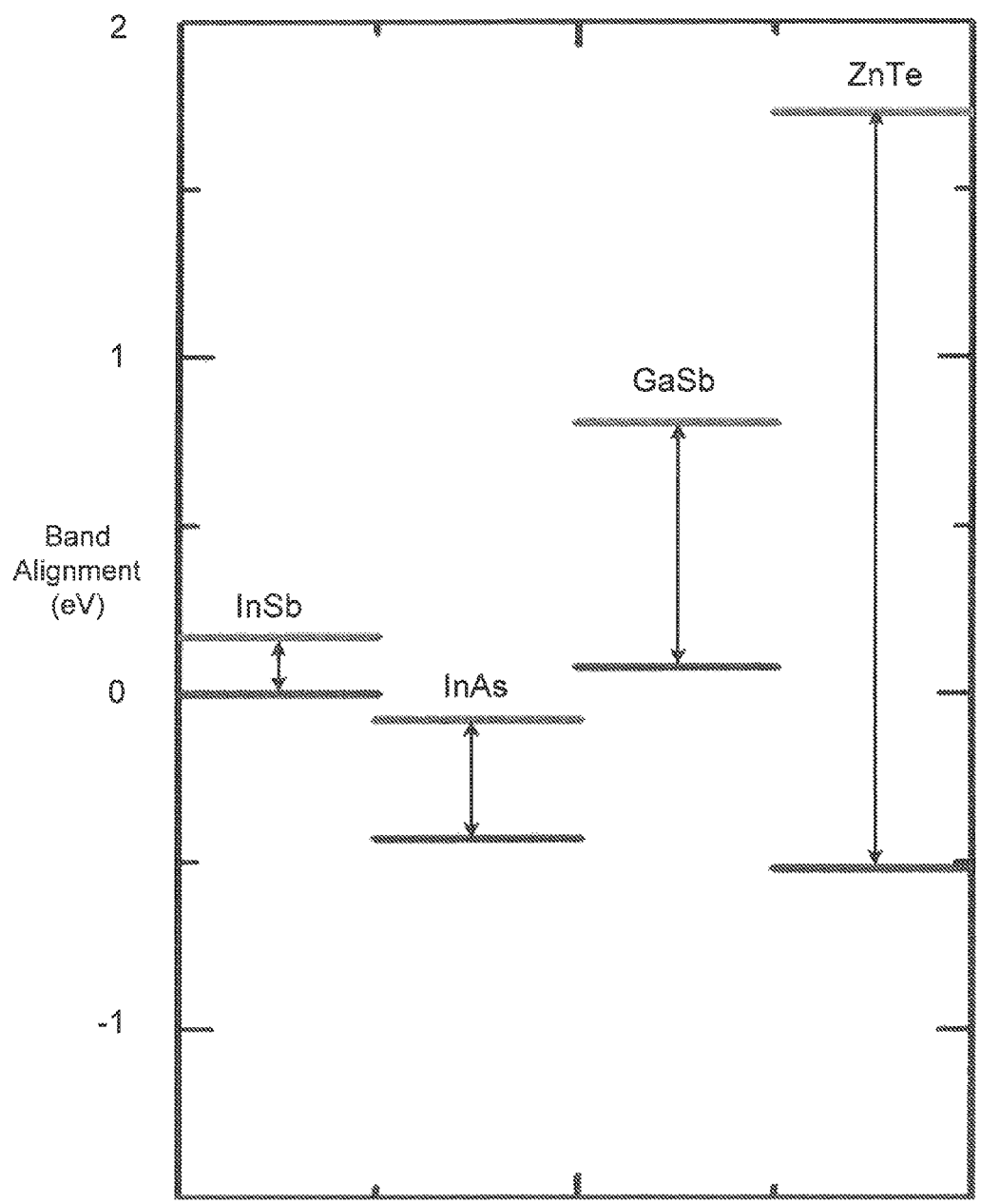
FIG. 1C illustrates a chart of band alignment for exemplary semiconductor alloys in accordance with an exemplary embodiment.

With reference now to FIGS. 1A through 1C, in various exemplary embodiments a semiconductor system 100 may be constructed using ~6.1 Å group II-VI (for example, (Mg-ZnCdHg)(SeTe)) and/or group III-V (for example, (InGaAl)(AsSb)) semiconductor materials (for example, grown on a suitable substrate such as GaSb). In various exemplary embodiments, semiconductor system 100 can comprise switching components (for example, a FET) as well as optoelectronic components (for example, high-efficiency multi-junction solar cells, photodetectors, lasers, and/or the like).

These semiconductor binaries and their alloys have direct bandgaps covering the entire energy spectrum from far infrared (IR) (~0 electron-volts (eV)) to ultraviolet (UV) (~3.4 eV), as shown in FIGS. 1A and 1B. In various exemplary embodiments, ZnTe virtual substrates may be utilized on various binary substrates such as silicon (Si), gallium arsenide (GaAs), indium phosphide (InP), and/or the like. These new virtual substrates, which may utilize highly resistive ZnTe grown on an insulating substrate such as Si and/or GaAs, overcome a major drawback of GaSb substrates because such substrates are quite conductive at room temperature due to their small bandgap, rendering them unsuitable for many electronic device applications.

Continuing to reference FIGS. 1A-1C, in accordance with various exemplary embodiments a 6.1 Å semiconductor family provides a unique materials platform, which not only covers a broad bandgap energy range from UV to long wavelength infrared (LWIR), but also offers very high mobilities for both electrons and holes and is thus highly desirable for electronic devices. For example, in various exemplary embodiments, utilizing a 6.1 Å semiconductor family to form devices allows electron hole mobility may be increased by an order of magnitude or more as compared to silicon-based devices. Additionally, principles of the present disclosure contemplate the use of InAsSb/ZnTe and InGaSb/ZnTe double heterostructures grown on Si substrates for complementary metal oxide silicon (CMOS) integrated circuits. This materials platform also enables monolithic integration of optoelectronic devices with switching devices on a single chip. The resulting systems are suitable for high speed optical interconnects, sensing and imaging applications, and/or the like.

Figure 2:
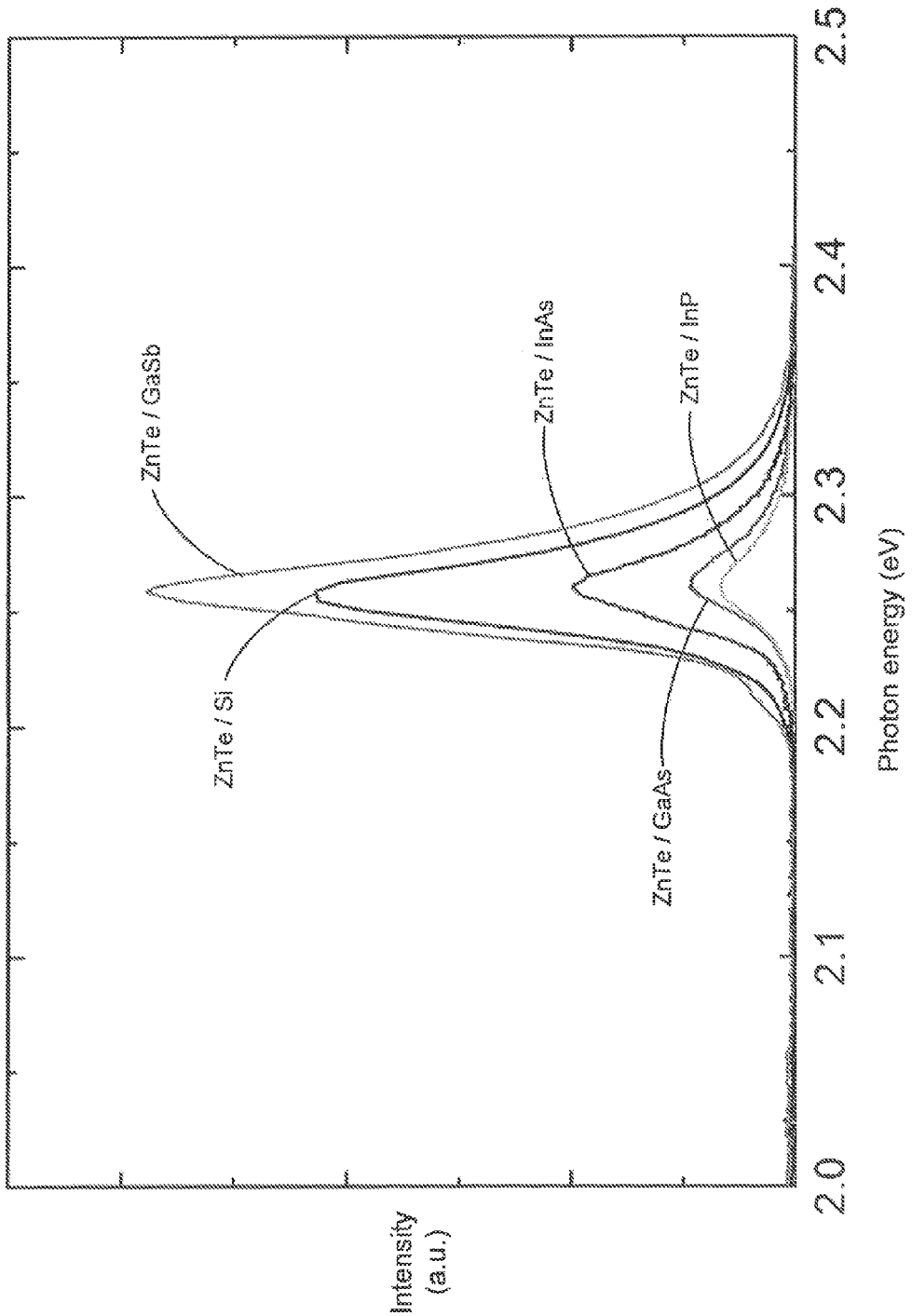
FIG. 2 illustrates photoluminescence of ZnTe on various substrates in accordance with an exemplary embodiment.

With reference now to FIG. 2, in various exemplary embodiments, high-quality single crystal ZnTe may be grown on various substrates, for example GaSb, Si, InAs, and/or the like. As illustrated in FIG. 2, ZnTe crystal quality is particularly high when grown on GaSb or silicon.

Figure 3A:
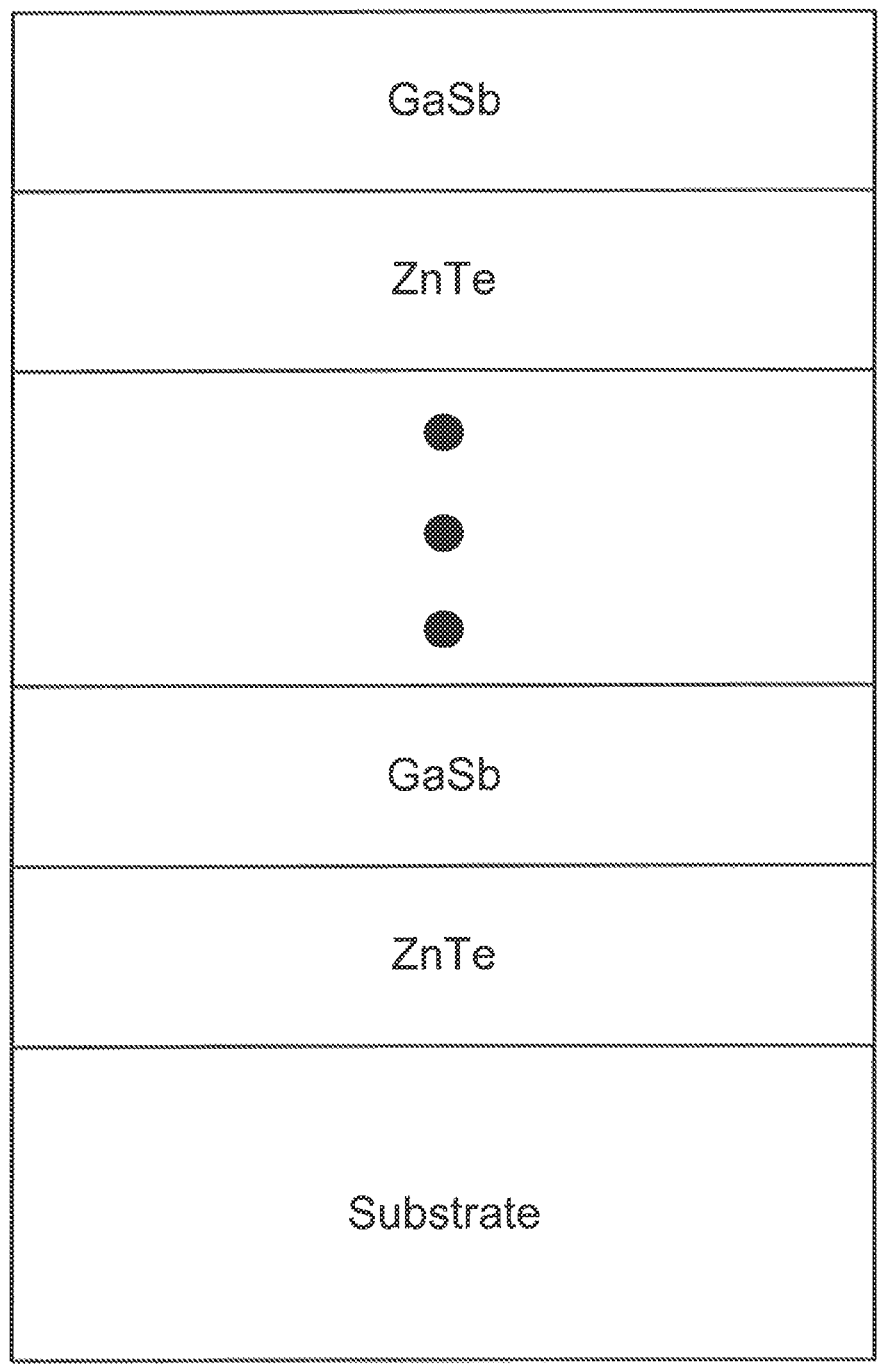
FIG. 3A illustrates an exemplary gallium antimonide (GaSb)/ZnTe distributed Bragg reflector (DBR) on a GaSb substrate in accordance with an exemplary embodiment.
Figure 3B:
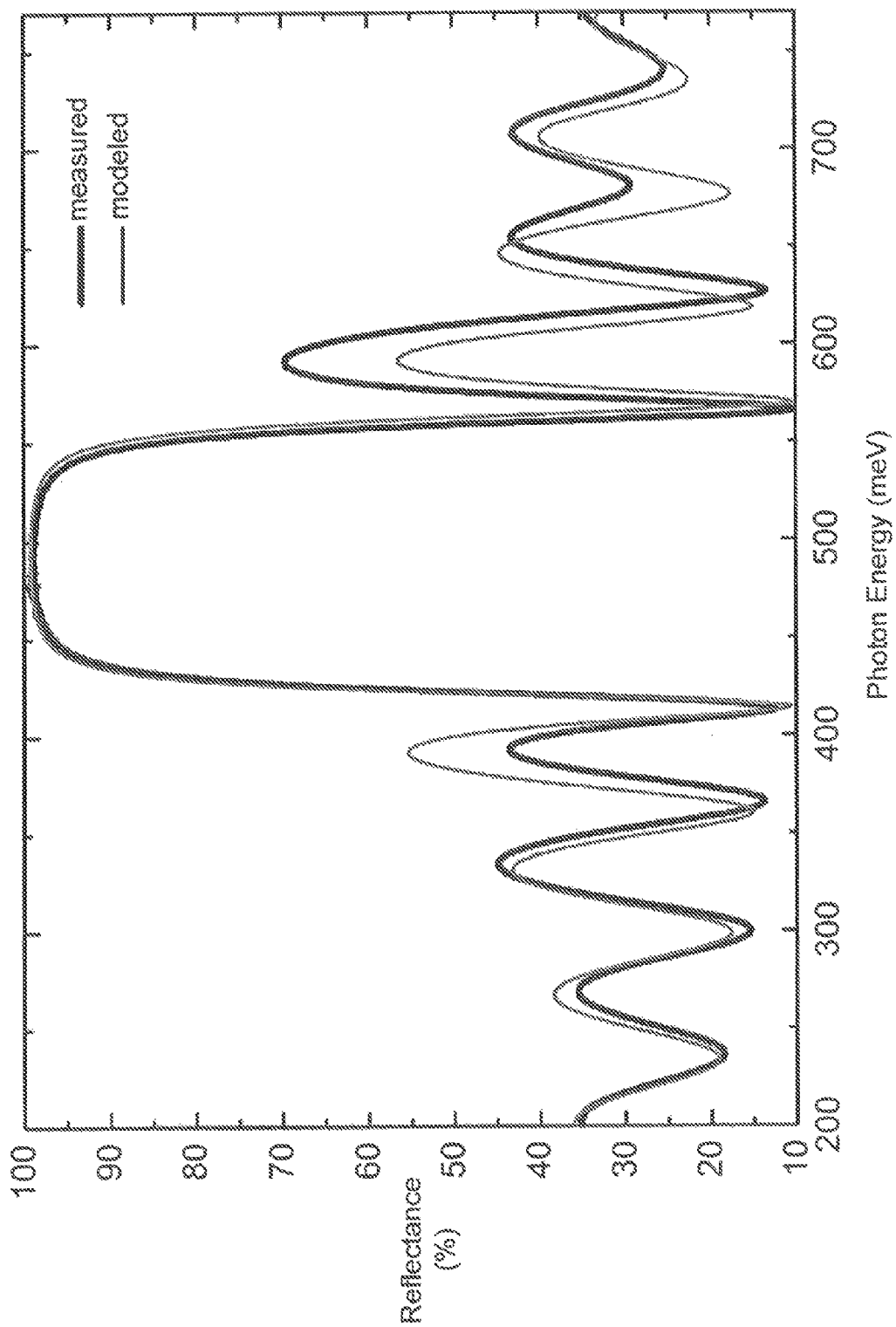
FIG. 3B illustrates measured and modeled reflectance of an exemplary GaSb/ZnTe DBR in accordance with an exemplary embodiment.

With reference now to FIGS. 3A and 3B, in various exemplary embodiments an exemplary DBR 300 may be fabricated using ZnTe and GaAs. In an exemplary embodiment, a 10-pair GaSb/ZnTe DBR on a GaSb substrate is configured with a total thickness of 3.6 μm, a refractive index difference (Δn) between GaSb and ZnTe of 1.18, and achieves 99.9% reflectivity for light having a wavelength of 2 μm. Additional details regarding exemplary DBRs are disclosed in J. Fan et al., *Molecular beam epitaxial growth of high-reflectivity and broad-bandwidth ZnTe/GaSb distributed Bragg reflectors*, J. Vac. Sci. Technol. B 31, 03C109 (2013), the contents of which are incorporated herein by reference. It will be appreciated that the number of pairs and other characteristics of DBR 300 may be varied, as desired, in order to achieve desired wavelength and/or reflectivity targets.

Figure 3C:
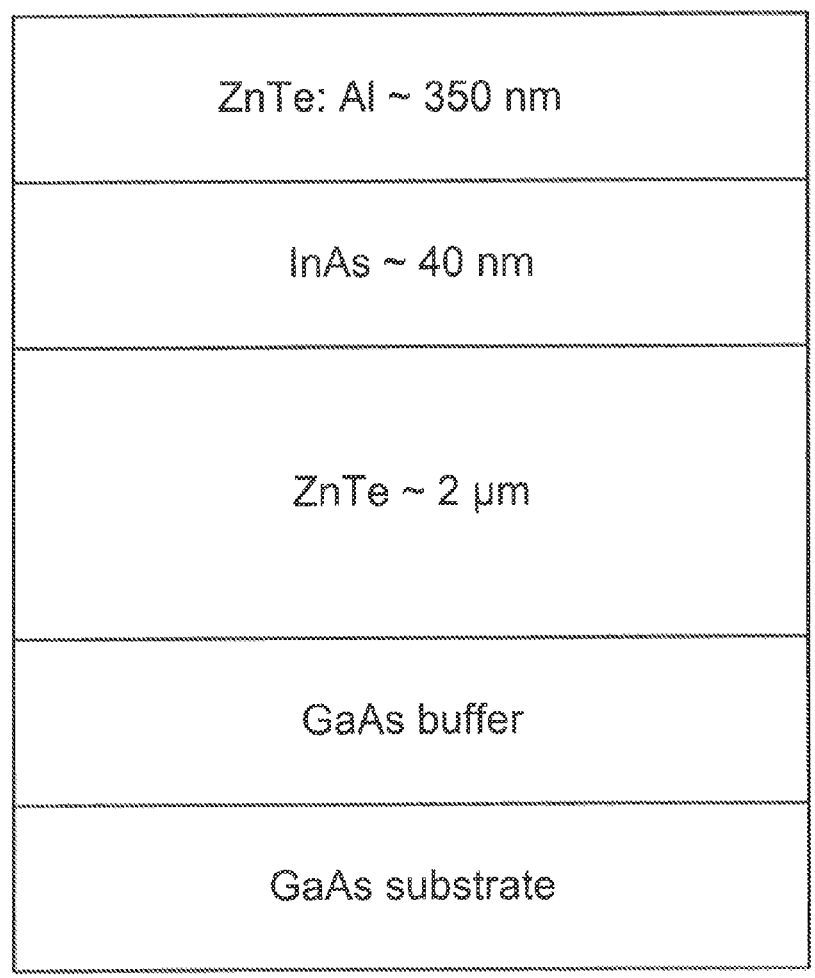
FIG. 3C illustrates an exemplary ZnTe/indium arsenide (InAs)/ZnTe double heterostructure in accordance with an exemplary embodiment.
Figure 3D:
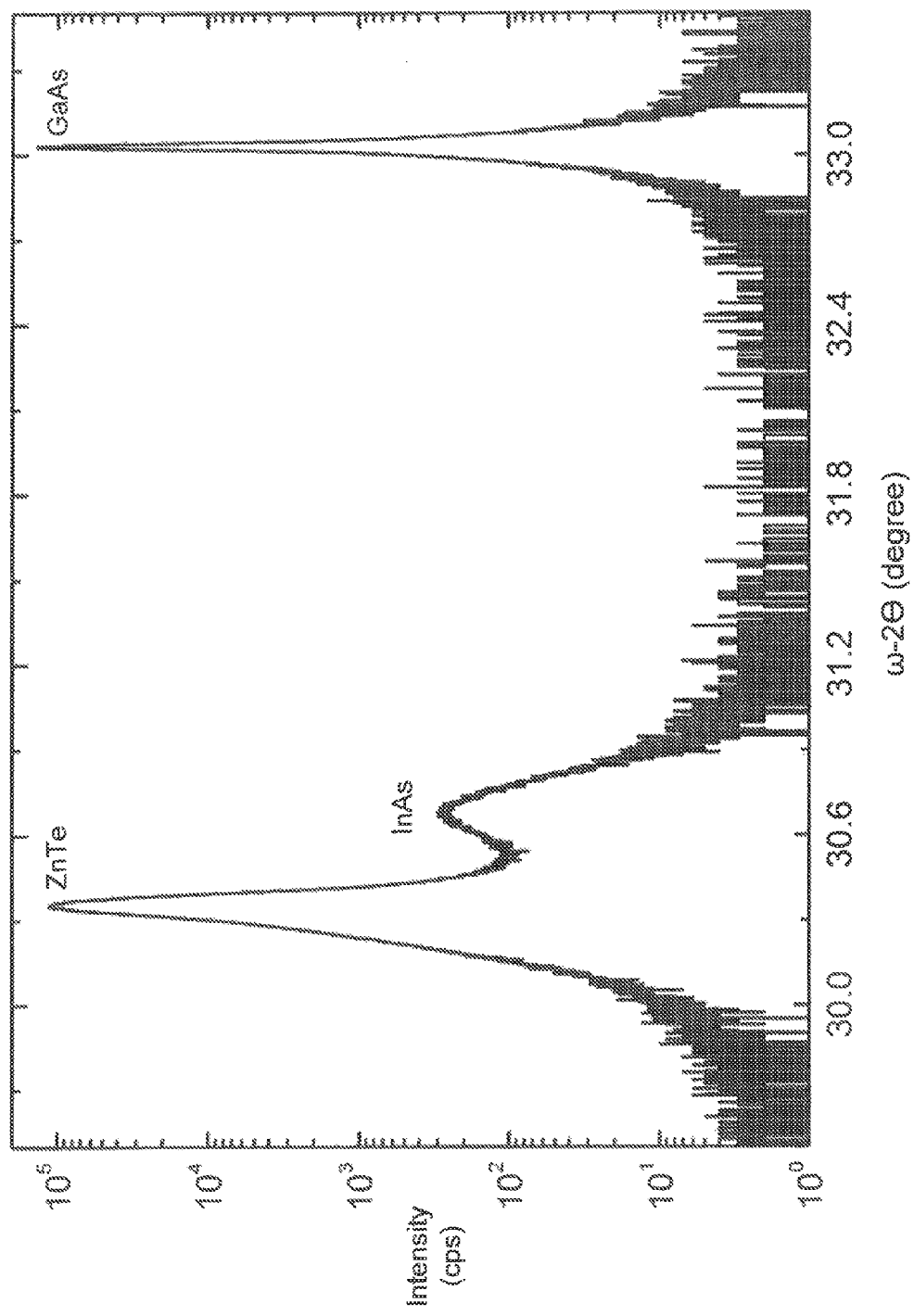
FIG. 3D illustrates an x-ray rocking curve of the double heterostructure of FIG. 3C in accordance with an exemplary embodiment.

Turning now to FIGS. 3C and 3D, in various exemplary embodiments a modulation doped ZnTe/InAs/ZnTe double heterostructure may be grown on a suitable substrate, for example GaAs, silicon, and/or the like. The x-ray rocking curve of FIG. 3D illustrates that crystalline quality of the double heterostructure is suitable for electronic purposes.

Figure 4A:
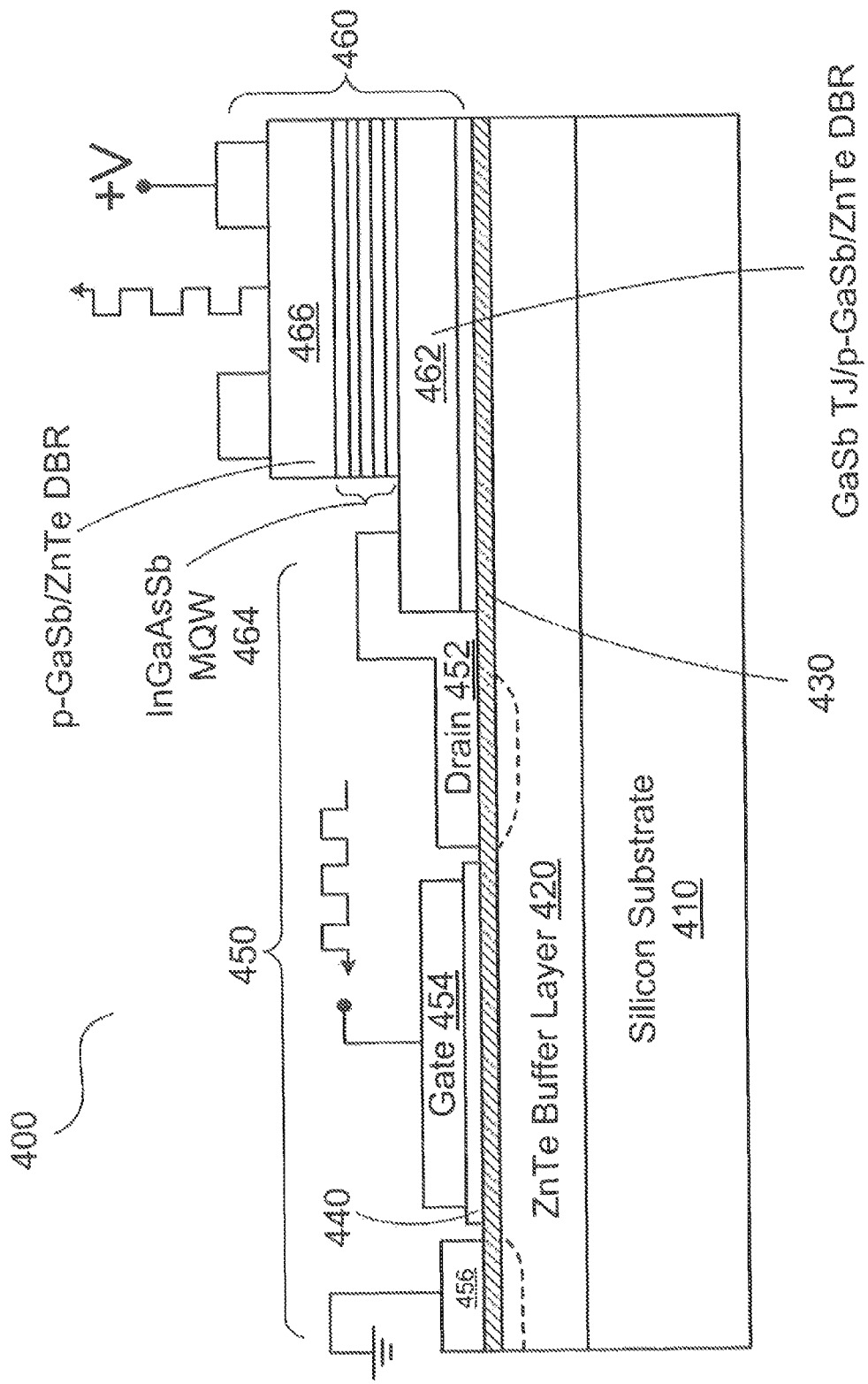
FIG. 4A illustrates a metal oxide silicon field effect transistor (MOSFET) structure integrated with a vertical-cavity surface-emitting laser (VCSEL) structure in accordance with an exemplary embodiment.
Figure 4B:
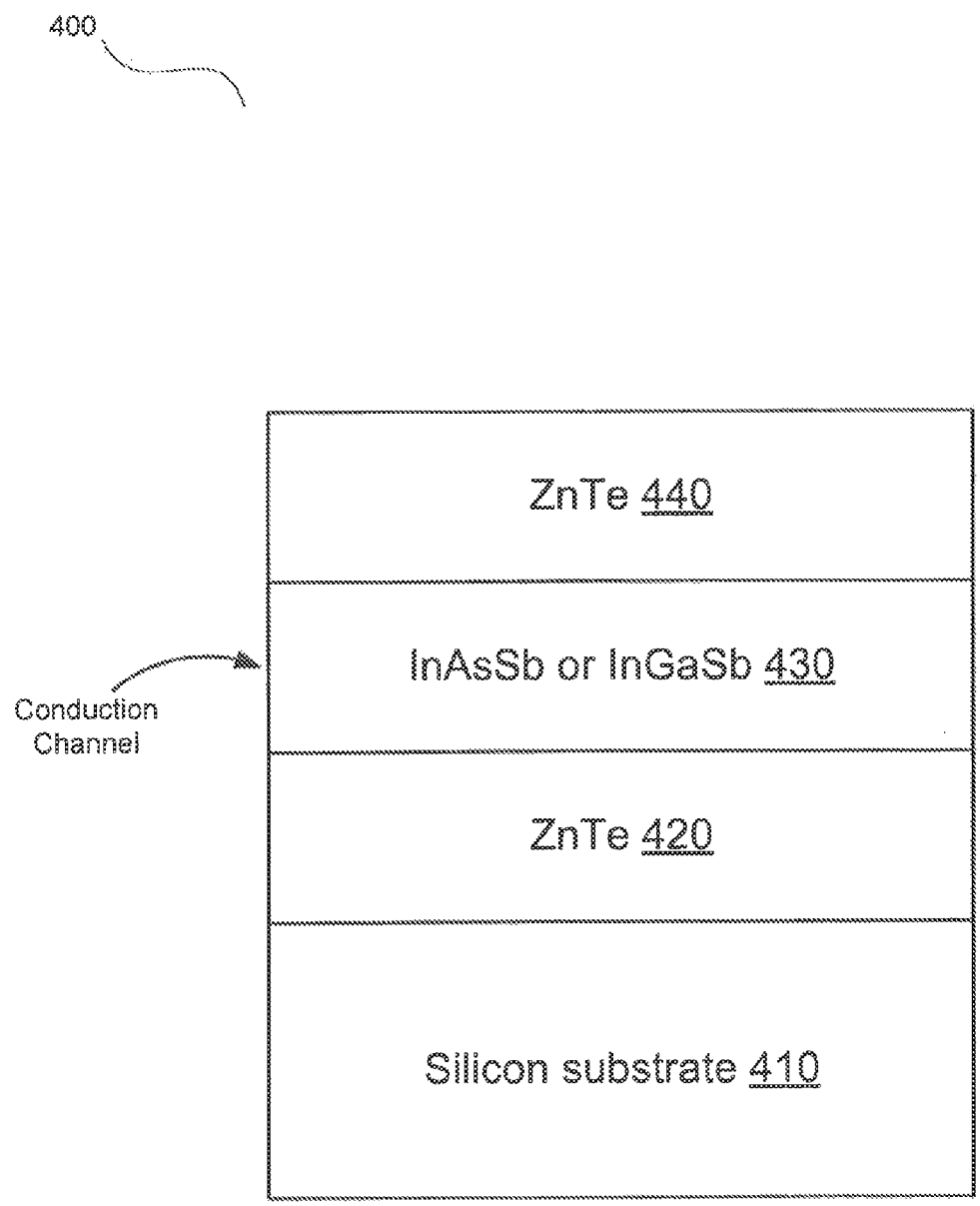
FIG. 4B illustrates a closer view of a conduction channel of the devices of FIG. 4A in accordance with an exemplary embodiment.

Additionally, principles of the present disclosure contemplate new and/or modified structures and/or couplings for electronic devices, for example a switching device (such as a FET) and an optoelectronic device (such as a VCSEL). With reference now to FIGS. 4A and 4B, in various exemplary embodiments, in a semiconductor system 400 a silicon substrate 410 may have a ZnTe buffer layer 420 grown thereon. Semiconductor system 400 may further comprise at least one conduction channel 430. In semiconductor system 400, GaSb or other modulation doped III-V heterostructures, for example grown on ZnTe buffer layer 420, can be used as one or more conduction channels 430. Conduction channels 430 may comprise InAs, InAsSb, GaSb, corresponding modulation-doped quantum well structures, and/or the like.

In semiconductor system 400, an undoped ZnTe single crystal layer 440 (for example, grown on GaSb) may be utilized as the gate insulator for FET 450. Because the bandgap of ZnTe is 2.3 eV, it has high resistivity and offers high breakdown voltage. Additionally, the dielectric constant of ZnTe is also much higher than that of silicon oxides. Since ZnTe is a single crystal, one can grow very thin layers 440, on the order of one or a few mono layers, enabling further scaling (i.e., size reduction) of FET 450.

In various exemplary embodiments, FET 450 comprises drain 452, gate 454, and source 456. In various exemplary embodiments, drain 452 and source 456 are coupled to and/or deposited atop conduction channel 430.

In semiconductor system 400, in various exemplary embodiments a VCSEL 460 comprises upper DBR 466, active region 464, and lower DBR 462. In certain embodiments, active region 464 comprises an InGaAsSb multi-quantum well (MQW) structure.

In various prior approaches, the lower DBR of a VCSEL is doped to improve electrical properties (i.e., current injection from a channel). However, this doping can introduce optical absorption, which can reduce the reflectivity of the DBR stack, and thus result in degraded optical properties for the VCSEL. In contrast, application of principles of the present disclosure allow for improved electrical properties while preserving optical properties, for example by coupling the drain of a FET to the top layer of the lower DBR of a VCSEL.

With continued reference to FIG. 4A, in various embodiments drain 452 of FET 450 is directly coupled to the top layer of lower DBR 462 of VCSEL 460. The top layer of lower DBR 460 is doped in a manner configured to facilitate this connection. In this manner, current may be injected into VCSEL 460 from FET 450 via drain 452. This configuration allows current injection into lower DBR 462 from FET 450, without the need to dope multiple layers of lower DBR 462 in order to obtain sufficient current from conduction channel 430. Accordingly, VCSEL 460 does not suffer from the optical degradation that would occur responsive to further doping of lower DBR 462. VCSEL 460 is operable to generate light in active region 464, and light is emitted as shown through upper DBR 466 as is known in the art.

In an exemplary embodiment, lower DBR 462 comprises a top layer that is doped to directly couple to drain 452. In this exemplary embodiment, the remaining layers of lower DBR 462 are undoped and/or doped differently from that of the top layer.

In various exemplary embodiments, rather than the VCSEL illustrated in FIG. 4A, other optoelectronic elements may be fabricated and/or integrated utilizing the materials and principles of the present disclosure. For example, semiconductor system 400 may comprise or include one or more of an edge-emitting laser, an infrared LED, an infrared detector, and/or an infrared modulator. More broadly, semiconductor system 400 may incorporate and/or include various resonant cavity structures. Moreover, optoelectronic elements from IR to UV may be fabricated and/or integrated. In various exemplary embodiments, a drain of a FET may be directly coupled to a doped layer of an optoelectronic device in order to provide improved current injection thereto.

As illustrated in Table 1 below, an advantage of the semiconductor materials systems and semiconductor device (e.g, FET) designs disclosed in the foregoing exemplary embodiments is that InAs, InSb, GaSb and other 6.1 Å semiconductors have very high mobilities for electrons and holes, which are highly desirable for complementary devices.

FETs) and/or optoelectronic devices may be monolithically integrated on a silicon substrate with conventional CMOS circuits. This complementary hybrid integration of silicon and compound semiconductor electronic devices enables highly desirable analog and digital circuits on one single chip with unprecedented performance.

In various exemplary embodiments, principles of the present disclosure may also be applied to reduce manufacturing expenses for semiconductor devices. Because principles of the present disclosure facilitate use of high-mobility InAs/InSb/InAsSb and/or the like, rather than silicon, as a conduction channel, semiconductor devices may be fabricated using older and/or cheaper processes (for example, a 600 nm, 350 nm, 250 nm, 180 nm, and/or 130 nm process), rather than using newer and/or more expensive processes (for example, a 65 nm, 45 nm, and/or 32 nm process) while still offering comparable or even superior performance. Yet further, in various exemplary embodiments principles of the present disclosure may be applied to significantly improve the performance of devices formed using current fabrication processes, for example by providing high-mobility channel capability.

It will be appreciated by those skilled in the art that semiconductor materials and devices configured in accordance with principles of the present disclosure may be utilized for various applications, and the foregoing examples are by way of illustration and not of limitation.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

TABLE 1

|  | Eg (eV) | Electron effective mass ($m_0$) | Hole effective mass ($m_0$) HL | Hole effective mass ($m_0$) LH | $\mu_e$ (cm$^2$/Vs) | $\mu_h$ (cm$^2$/Vs) | $\epsilon_r$ | Thermal expansion coefficients ($10^{-6}$ K$^{-1}$) |
|---|---|---|---|---|---|---|---|---|
| Si | 1.1 | 0.98/0.19 | 0.49 | 0.16 | 1,500 | 450 | 13 | 2.6 |
| GaAs | 1.4 | 0.067 | 0.45 | 0.082 | 8,500 | 400 | 13 | 5.7 |
| InAs | 0.36 | 0.024 | 0.26 | 0.027 | 33,000 | 450 | 15 | 8.3 |
| InSb | 0.17 | 0.014 | 0.43 | 0.015 | 80,000 | 1,250 | 18 | 4.7 |
| GaSb | 0.73 | 0.047 | 0.22 | 0.045 | 12,040 | 1,624 | 16 | 6.4 |
| ZnTe | 2.3 | 0.124 | 0.68 | 0.154 | 220 | 100 | 7.2 | 5.0 |

In accordance with an exemplary embodiment and in connection with growth of ZnTe on silicon substrates as contemplated herein, exemplary switching devices (for example, As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection. When language similar to "at least one of A, B, or C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A semiconductor system, comprising:
   a field-effect transistor (FET); and
   a vertical-cavity surface-emitting laser (VCSEL) comprising an upper distributed Bragg reflector (DBR), an active region, and a bottom DBR,
   wherein the FET and VCSEL are formed on a single wafer, and
   wherein the top layer of the lower DBR is directly coupled to the drain of the FET.

2. The semiconductor system of claim 1, wherein a gate insulator of the FET comprises zinc telluride (ZnTe).

3. The semiconductor system of claim 1, wherein a conduction channel of the FET comprises at least one of indium arsenide antimonide ($InAs_xSb_{1-x}$) or indium gallium antimonide ($InGa_ySb_{1-y}$), where $0 \leq x, y \leq 1$.

4. The semiconductor system of claim 3, wherein the conduction channel of the FET has an electron mobility between 1,500 cm$^2$/Vs and 33,000 cm$^2$/Vs.

5. The semiconductor system of claim 1, wherein the single wafer is formed of silicon.

6. The semiconductor system of claim 1, wherein the single wafer is formed of GaSb.

7. The semiconductor system of claim 1, wherein all semiconductor layers in the FET and the VCSEL have a lattice constant varying from 6.1 angstroms by less than 1.6%.

8. The semiconductor system of claim 1, wherein the top layer of the lower DBR is doped to couple to the drain of the FET, and wherein all other layers of the lower DBR are either undoped or doped in a manner configured to minimize optical degradation of the lower DBR.

9. The semiconductor system of claim 1, wherein the semiconductor system, when constructed via a first semiconductor fabrication process having a feature size exceeding 90 nm, is configured with performance exceeding that of a second semiconductor system comprising CMOS devices and constructed via a second semiconductor fabrication process having a feature size smaller than 45 nm.

10. A method for constructing a semiconductor system, comprising:
    forming, on a silicon substrate, a single-crystal buffer layer of ZnTe;
    forming, on the single-crystal buffer layer, an electronic switch; and
    forming, on the single-crystal buffer layer, an optoelectronic device.

11. The method of claim 10, wherein the electronic switch is a FET, and
    wherein the optoelectronic device is a VCSEL.

12. The method of claim 11, wherein a gate insulator of the FET is formed of ZnTe, and wherein the drain of the FET is directly coupled to a portion of the VCSEL.

13. The method of claim 10, wherein all semiconductor layers in the electronic switch and the optoelectronic device have a lattice constant varying from 6.1 angstroms by less than 1.6%.

14. The method of claim 10, wherein the conduction channel of the FET has an electron mobility in excess of 1,500 cm$^2$/Vs.

15. A semiconductor field-effect transistor (FET), comprising:
    a source;
    a drain; and
    a gate coupling the source and the drain and operable to modulate current therebetween, wherein a gate insulator of the FET comprises single crystal zinc telluride (ZnTe).

16. The FET of claim 15, wherein the ZnTe is undoped.

17. The FET of claim 15, wherein the gate insulator of the FET is grown atop a conduction channel comprising at least one of indium arsenide antimonide ($InAs_xSb_{1-x}$) or indium gallium antimonide ($InGa_ySb_{1-y}$), where $0 \leq x, y \leq 1$.

* * * * *